United States Patent [19]

Lindmayer et al.

[11] 4,184,894

[45] Jan. 22, 1980

[54] INTEGRATED PHOTOVOLTAIC GENERATOR

[75] Inventors: Joseph Lindmayer, Bethesda; Charles Y. Wrigley, Gaithersburg, both of Md.

[73] Assignee: Solarex Corporation, Rockville, Md.

[21] Appl. No.: 907,621

[22] Filed: May 19, 1978

[51] Int. Cl.² .......................................... H01L 31/06
[52] U.S. Cl. .............................................. 136/89 MS
[58] Field of Search ............ 136/89 P, 89 SJ, 89 MS; 357/30, 46, 47, 48, 301

[56] References Cited

U.S. PATENT DOCUMENTS

| 2,875,505 | 3/1959 | Pfann | 29/25.3 |
| 3,546,542 | 12/1970 | Riel et al. | 136/89 X |
| 3,994,012 | 11/1976 | Warner, Jr. | 357/30 |
| 4,042,418 | 8/1977 | Biter | 136/89 P |
| 4,144,096 | 3/1979 | Wada et al. | 136/89 P |

OTHER PUBLICATIONS

B. A. Agusta et al., "Monolithic, Integrated Semiconductor Device," *IBM Tech. Disc. Bull.*, vol. 9, pp. 551–552, (1966).

*Primary Examiner*—Aaron Weisstuch
*Attorney, Agent, or Firm*—Watson, Cole, Grindle & Watson

[57] ABSTRACT

Disclosed is an integrated photovoltaic generator containing a plurality of photovoltaic cells, the generator capable of producing a voltage greater than that generated by a single photovoltaic cell of comparable chemical composition. The generator comprises a wafer of semiconductor material having two major surfaces, at least one of the major surfaces including a plurality of discrete areas containing an impurity of one type of conductivity, at least the portion of the remainder of the wafer contiguous to the areas containing an impurity of an opposite conductivity type, and electrical conductor means between at least one area and the portion of the wafer containing the impurity of the opposite conductivity type.

7 Claims, 5 Drawing Figures

INTEGRATED PHOTOVOLTAIC GENERATOR

BACKGROUND OF THE INVENTION

The present invention relates generally to photovoltaic cells commonly referred to as solar cells and, more particularly, is directed to integrated photovoltaic generators containing at least two photovoltaic cells.

As is well known in the art, photovoltaic cells are semiconductor devices having electrical junctions which are capable of converting incident light into electrical energy. With silicon type photovoltaic cells, a single cell is typically capable of generating an electrical potential of up to about 0.5 volts with sufficient incident light. Since most photovoltaic cell applications require a voltage greater than 0.5 volt, it has been common practice to electrically connect a plurality of cells in series to thereby form a photovoltaic generator capable of producing the desired voltage.

A commonly used method for making such a photovoltaic generator, particularly for generators of minimum size to be used by the digital watch industry to recharge a watch battery, is to provide a plurality of cells, each having a metallized contact surface coplanar with each major surface of the cell and then join the cells in a "shingle" type assembly. In such an assembly, the metallized portion of the top surface of one cell is joined by soldering to the metallized portion of the bottom surface of another cell, the metallized top portion of the latter cell being joined to the bottom portion of yet another cell, etc., such that each cell of the generator partially overlaps adjacent cells. In this manner, the desired number of cells to provide the required voltage for the generator can be achieved in a compact and sturdy assembly of cells.

A disadvantage of such an assembly for a photovoltaic generator, among others, is that generally the cells must be joined to each other in a manual operation. Even with specially designed features and sophisticated assembly aids, the labor component of the total cost of photovoltaic generator of the type described above is unacceptably high.

SUMMARY OF THE INVENTION

It is therefore an object of the present invention to provide a photovoltaic generator which can be manufactured with significantly reduced labor costs.

Another object of the present invention is to provide a photovoltaic generator having higher photovoltaic voltage than is obtainable from a single cell.

Yet another object of the present invention is to provide a method for making photovoltaic generators wherein labor associated costs of the manufacture are significantly reduced.

Briefly, the present invention comprehends a photovoltaic generator capable of producing a voltage greater than that generated by a single photovoltaic cell of comparable chemical composition, the generator comprising a wafer of semiconductor material having two major surfaces, at least one of the major surfaces including a plurality of discrete areas containing an impurity of one type of conductivity, at least the portion of the remainder of the wafer contiguous to the areas containing an impurity of an opposite conductivity type, and electrical conductor means between at least one of said discrete area and its associated contiguous portion of the wafer containing the impurity of the opposite conductivity type.

The present invention also comprehends a method for making a photovoltaic generator comprising providing a wafer of semiconductor material having two major surfaces, the wafer containing an impurity of one type of conductivity, and forming at least two areas containing an impurity of an opposite type of conductivity on one major surface of the wafer, at least one area being electrically connected to the remainder of the wafer.

Further objects, advantages and features of the present invention will become more fully apparent from a detailed construction of the arrangement and construction of the constituent parts as set forth in the following specification taken together with the accompanying drawing.

DESCRIPTION OF THE PREFERRED EMBODIMENTS

Figure 1:
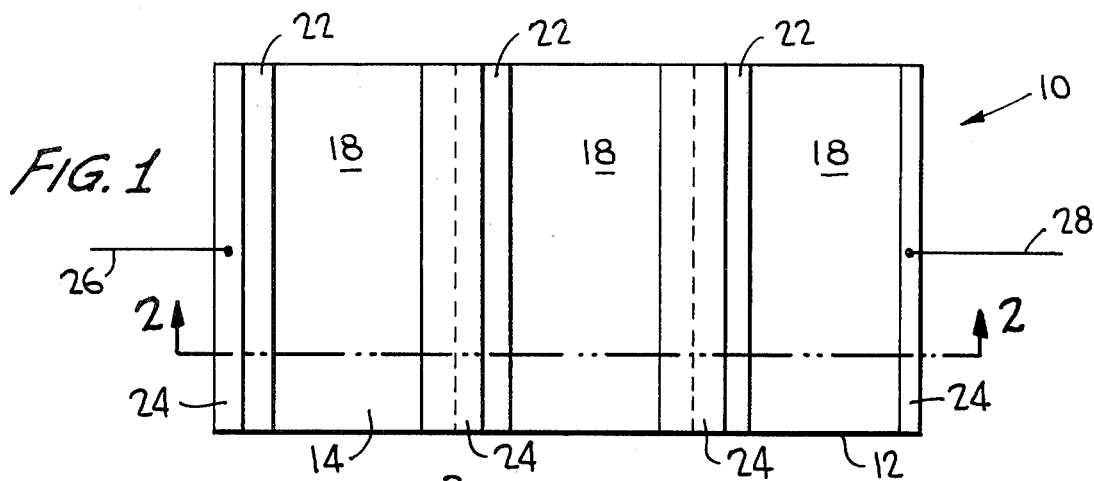
FIG. 1 is a top view of one embodiment of a photovoltaic generator in accordance with the present invention.
Figure 2:
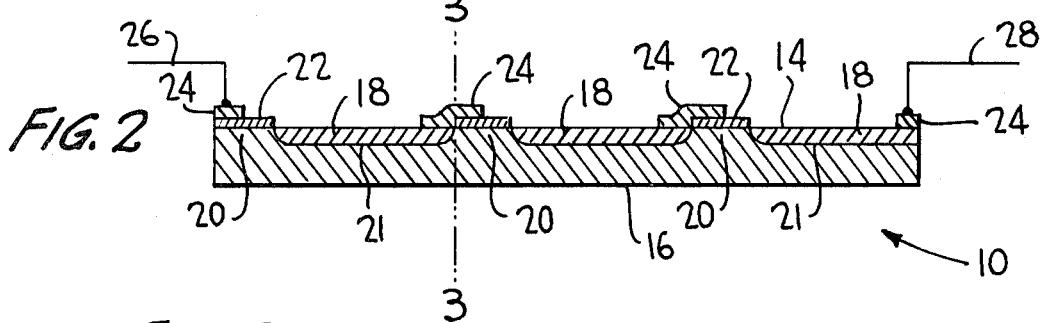
FIG. 2 is a cross-sectional view of the generator of FIG. 1 taken along line 2-2.

Referring now to FIGS. 1 and 2, shown is photovoltaic generator 10 including wafer 12 of silicon material. Wafer 12 is in the form of a rectangular plate having a relatively large length and width compared to its thickness. Thus wafer 12 has two major surfaces, top surface 14 and bottom surface 16. On top surface 14 are three areas 18 having an impurity of one conductivity such as phosphorus, the remainder of the wafer 12 contiguous to the areas containing an impurity of opposite conductivity such as boron. Each area 18 is therefore separated from adjacent areas by strips 20 of silicon material having an impurity of opposite conductivity extending to top surface 14. In this manner, a plurality of junctions 21 are formed between the contiguous portions of silicon wafer 12 having one conductivity and the portions having the opposite conductivity.

Directly on top of each of strips 20 is thin layer 22 of masking material such as thermally grown silicon dioxide. Overlying a portion of each layer 22 and a portion of each area 18 is electrical conductor 24 which penetrates through layer 22 to provide a direct electrical connection between an area and a strip. Electrical wires 26 and 28 provide external electrical connection for generator 10.

Thus generator 10 as shown comprises three photovoltaic cells in a single wafer of silicon, the cells connected in series by electrical conductors 24. Of course, wafer 12 could contain more than three distinct cells to produce the desired voltage output from generator 10, the particular number of cells having been shown for the purpose of illustration only.

Preferably, as is shown in FIG. 2, area 18 which has attached electrical wire 28 is not electrically connected by a conductor 24 to the remainder of wafer 12. Thus, this portion of generator 10 is capable of functioning as a conventional solar cell as is explained hereinafter and the generator as a whole therefore may have an improved output capability at low levels of illumination due to this portion.

Figure 3:
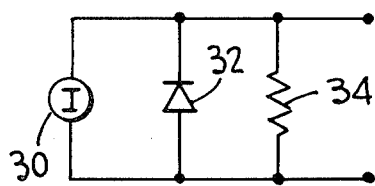
FIG. 3 is an electrical schematic of a portion of the generator of FIGS. 1 and 2.

FIG. 3 is an electrical schematic for one cell of generator 10. If electrical connectors 24 bridging from areas 18 to strips 20 were removed, each cell of the generator would function simply as a combination of current generator 30 and diode 32. With the addition of bridging electrical conductors 24 to produce the series connection of a plurality of cells, a resistance 34 appears in parallel with diode 32. For generator 10 to function efficiently as a photovoltaic generator, resistance 34 for each cell should be as large as possible.

The factors which determine resistance 34 for each cell of generator 10 include the inherent resistivity of the semiconductor material of wafer 12, the distance between strips 20, i.e., the width of areas 18, and the thickness of the wafer. Generally, the resistivity of a semiconductor material increases with increasing purity of the material. Thus, when silicon is used as the semiconductor material, the silicon should be as pure as possible balanced against the cost of such material. In addition, generally as the distance between strips 20 is increased or as the thickness of wafer 12 is reduced, the resistance is increased for each cell. Thus for maximum voltage from generator 10, the resistivity of the semiconductor material and the width of areas 18 should be as great as possible while the thickness of wafer 12 should be as thin as possible.

For example, it has been found that a photovoltaic generator made from silicon having a resistivity of about 100Ω-cm and having an area width to thickness ratio of about 10:1 provides sufficient resistance for the generator to effectively operate. Alternatively, a photovoltaic generator made of silicon having a resistivity of 50Ω-cm and an area width to thickness ratio of 20:1 is also acceptable.

The material used to form electrical conductors 24 may be almost any electrically conductive material that can be easily and economically applied to the wafer. Presently preferred materials include aluminum and the titanium-palladium-silver material disclosed in U.S. patent application Ser. No. 795,550 filed May 10, 1977 now U.S. Pat. No. 4,082,568. Although thermally grown silicon dioxide is the presently preferred material for use in masking areas 18 to be formed, other materials such as tantalum oxide, silicon nitride and the like may be used.

Figure 4:
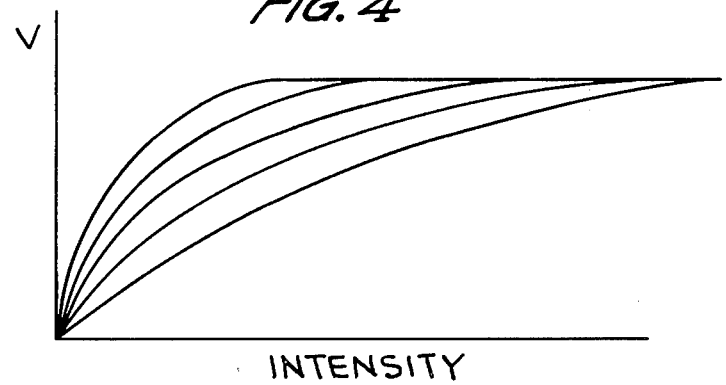
FIG. 4 is a graph of voltage versus light intensity for various generators in accordance with the present invention having different resistive characteristics.

FIG. 4 qualitatively illustrates the effect of the resistance on the output characteristics of a generator in accordance with the present invention. Each line of the graph is a plot of the output voltage at increasing illumination for various photovoltaic generators having different resistances. Those plots to the right are for generators having a relatively low resistance while those to the left have a relatively high resistance. As is apparent, generators having a relatively high resistance should be utilized to maximize voltage output at low levels of illumination.

Photovoltaic generator 10 as shown in FIGS. 1 and 2 may be made by a variety of methods as is evident to one of ordinary skill in the art of semiconductor devices. A presently preferred method is to first provide a wafer 12 of suitable dimensions consisting of monocrystalline silicon material having a p-type impurity such as boron therethrough. After a thorough cleaning of wafer 12, a thin layer of silicon dioxide is thermally grown over the entirety of top surface 14 and then a mask is photolithographically placed over the layer of silicon dioxide. Layer 22 corresponding to strips 20 is saved while the remainder of the layer of silicon dioxide corresponding to areas 18 is chemically removed. The photolithographic mask (not shown) is then also removed.

After removal of the mask, an n-type impurity such as phosphorus is diffused into top surface 14 of wafer 12 to produce a plurality of areas 18 having an opposite conductivity to that of the remainder of wafer 12. A photolithographic mask is applied such that a portion of each layer 22 is covered by the mask as well as a portion of areas 18. Electrical conductors 24 are then applied to top surface 14 by vapor deposition of a metal or by other conventional methods. The metal of electrical conductors 24 is then caused to penetrate through the oxide layer 22 by heating at about 700° C. so as to provide electrical connection between areas 18 of n-type conductivity and strips 20 of p-type conductivity. Photovoltaic generator 10 is completed by slicing wafer 12 into appropriate sizes by slicing along lines similar to line 2—2 of FIG. 1 and line 3—3 of FIG. 2 and then attaching external connections 26 and 28.

Figure 5:
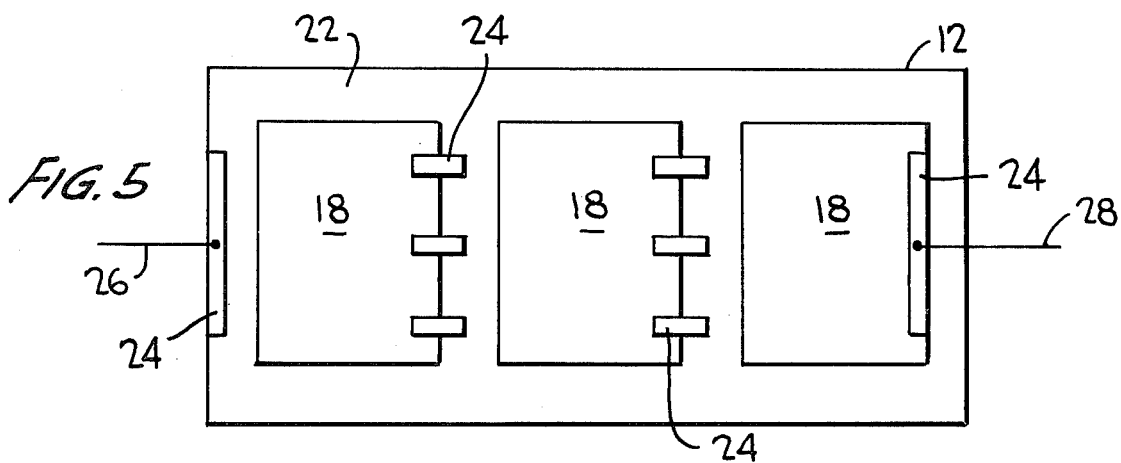
FIG. 5 is a top view of another embodiment of a photovoltaic generator in accordance with the present invention.

FIG. 5 illustrates an alternative embodiment of a photovoltaic generator according to the present invention. In this embodiment, electrical conductors 24 are in the form of discrete tabs rather than continuous bands as is shown in FIGS. 1 and 2. In addition, areas 18 do not extend the entire width of wafer 12. By appropriate choice of location of the discrete conductors 24 and the shape of areas 18, designs and/or characters may be formed on the top surface 14 of wafer 12 to thereby enhance the esthetic appeal of generator 10. Clearly, other configurations for areas 18 and conductors 24 than those shown in FIG. 5 are possible as well as different locations of the conductors relative to each other.

Particular details of a specific integrated photovoltaic generator and a method for making the generator are set forth in the following example. It should be understood that the example is given for the purpose of illustration only and the example does not limit the invention as has heretofore been described.

EXAMPLE

A photovoltaic generator suitable for use in electrically powered digital type wristwatches to recharge the battery of the watch is made in accordance with the present invention.

A circular wafer of silicon having a diameter of about 3" and a thickness of about 0.01" is provided, a boron impurity having been dispersed throughout the volume of the wafer. The silicon used in preparing the wafer has a resistivity of about 100Ω-cm. After cleaning, the wafer is inserted into a furnace maintained at about 900° C. having a steam containing atmosphere so as to thermally grow a layer of silicon dioxide on the major surface of the wafer. After about thirty minutes, the wafer is removed from the furnace. A photolithographic mask having thirty-one elongated windows is then applied over the silicon dioxide layer such that the windows extend across the width of the wafer. The portions of the silicon dioxide layer not covered by the mask are then chemically etched away and then the mask removed by washing with acetone. The top surface of the wafer is therefore divided into thirty areas by the strips of grown silicon dioxide.

The wafer is then placed within a diffusion furnace at about 900° C. having a flow of diffusion gas comprising about 100 parts argon, 10 parts oxygen, and 0.5 parts $PH_3$ so as to diffuse phosphorus into the areas of the wafer bounded by the strips of silicon dioxide. The diffusion is continued for about 20 minutes to provide the areas having a plurality of shallow n-p junctions below the top surface of the wafer.

A photolithographic mask is then applied to the wafer so that a portion of each strip of silicon dioxide and a significant portion of each area is covered by the mask. The wafer with applied mask is placed in a vacuum type coater containing a source of aluminum within a boat. The aluminum is then heated to about 1500° C. in a vacuum to vaporize the aluminum which then deposits on the portions of the wafer exposed by the mask to form electrical conductors between the areas of different conductivity to thereby bridge the n-p junctions. The mask is then removed.

The wafer is then trimmed and sliced into several generators each having a dimension of about 0.01"×0.2"×0.5" and five areas or cells. The wafer would be sliced along lines similar to line 2—2 of FIG. 1 and line 3—3 of FIG. 2 to form each generator. The generator is then completed by attaching an electrical wire to be in electrical contact with a diffused area on one end and another electrical wire to be in electrical contact with an area of different conductivity at the other end of the generator, the wires providing external electrical connection for the generator.

While there has been shown and described what is considered to be preferred embodiments of the present invention, it will be obvious to those skilled in the art that various changes and modifications may be made therein without departing from the invention as defined in the appended claims.

We claim:

1. A photovoltaic generator capable of producing a voltage greater than that generated by a single photovoltaic cell of comparable chemical composition, the generator comprising a wafer of semiconductor material having two major surfaces, at least one of the major surfaces including a plurality of discrete areas containing an impurity of one type of conductivity, at least a portion of the remainder of the wafer contiguous to said discrete areas containing an impurity of an opposite conductivity type, said discrete areas being at least partially covered by a layer of oxide, and electrical conductor means between at least one said discrete area and said contiguous portion of the wafer containing the impurity of the opposite conductivity type and overlying and penetrating through a portion of said oxide layer.

2. A photovoltaic generator according to claim 1 wherein said discrete areas are rectangular and extend across at least one of said major surfaces of the wafer.

3. A photovoltaic generator according to claim 2 wherein said electrical conductor means are metal bands on the major surface which extend along and bridge the photovoltaic junction between each said discrete area and said contiguous portion of the wafer.

4. A photovoltaic generator according to claim 1 wherein at least some of said discrete areas are completely bounded by semiconductor material having an impurity of opposite conductivity from the impurity of said discrete areas.

5. A photovoltaic generator according to claim 4 wherein said discrete electrical conductor means between each said discrete area and said contiguous portion of the wafer includes a plurality of discrete tabs.

6. A photovoltaic generator according to claim 1 wherein said electrical conductor means are metal bands on at least one said major surface which extend along and bridge the photovoltaic junction between each said discrete area and said contiguous portion of the wafer.

7. A photovoltaic generator according to claim 1 wherein said electrical conductor means between each said discrete area and said contiguous portion of the wafer includes a plurality of discrete tabs.

* * * * *